United States Patent
Lin et al.

(10) Patent No.: US 6,577,191 B2
(45) Date of Patent: Jun. 10, 2003

(54) AUTOMATIC GAIN CONTROL CIRCUIT FOR ANALOG SIGNALS

(75) Inventors: Syh-Shoei Lin, Jungli (TW); Sandra Young, Hsinchu (TW); Wen-Liang Tseng, Taipei (TW); Seng-Fa Chang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 20 days.

(21) Appl. No.: 09/986,482

(22) Filed: Nov. 8, 2001

(65) Prior Publication Data

US 2002/0129321 A1 Sep. 12, 2002

(30) Foreign Application Priority Data

Dec. 15, 2000 (TW) ..................................... 89221785 U

(51) Int. Cl.$^7$ ................................................. H03G 3/20
(52) U.S. Cl. ........................ 330/136; 330/86; 330/140; 330/144; 330/282; 330/284
(58) Field of Search .......................... 330/86, 136, 140, 330/144, 282, 284, 133, 254, 285

(56) References Cited

U.S. PATENT DOCUMENTS 5,438,683 A * 8/1995 Durtler et al. .............. 330/129
6,252,455 B1 * 6/2001 Kurby et al. ................ 330/136
6,424,212 B1 * 7/2002 Brandt ........................ 330/136

FOREIGN PATENT DOCUMENTS

JP          1177211       * 7/1989

OTHER PUBLICATIONS

Serdijn et al. "Low–Voltage Low Power Fully–Integratable Automatic Gain Controls" 1994 IEEE Symposium on Circuits and Systems, vol. 5, May 30–Jun. 2, 1994 pp. 505–508.*

* cited by examiner

Primary Examiner—Michael B Shingleton
(74) Attorney, Agent, or Firm—Intellectual Property Solutions, Incorporated

(57) ABSTRACT

A front-end signal-processing device having an automatic gain-control function used in the analog-to-digital conversion. The circuit comprises a buffer circuit, an amplifying/attenuating circuit, a pre-processing gain-adjusting circuit and an amplification/attenuation gain-adjusting circuit. In the front-end signal-processing device having an automatic gain-control function used in the analog-to-digital conversion, a set of gain-adjusting signals S1 and S2 are produced by hardware for controlling the amplification or attenuation gain of signals, thereby automatically adjusting the amplitude of the input signals. In addition, the microprocessor can select an appropriate restoring parameter according to the gain-adjusting signals to ensure that the numeral result conforms to the original input signal.

12 Claims, 7 Drawing Sheets

AUTOMATIC GAIN CONTROL CIRCUIT FOR ANALOG SIGNALS

BACKGROUND OF THE INVENTION

1. Field of the Invention

The present invention relates to a circuit for processing analog signals, and particularly to an automatic gain control circuit for analog signals.

2. Description of Related Art

The analog-to-digital circuit is usually used in all kinds of equipment such as computers, gauges and industrial controlling apparatus. It can transform analog signals (ex. temperature, pressure etc.) to digital signals that are easily received and further processed by the digital processor.

FIG. 1 (PRIOR ART) is a block diagram of a conventional analog-to-digital circuit with a single multiplication factor. The circuit comprises a signal detector 10, a pre-processing circuit 11, a signal amplifying/attenuating circuit 12, a sample/hold circuit 13, an analog-to-digital converter (ADC) 14 and a microprocessor 15. The signal detector 10 detects an analog input signal Vin. The pre-processing circuit 11 attenuates the analog input signal Vin to an analog signal Vin' with an amplitude that is acceptable for the system by an attenuation factor 1/a. Then, the signal amplifying/attenuating circuit 12 amplifies or attenuates the analog signal Vin' to an analog signal Vin" by an amplification gain b. The sample/hold circuit 13 samples and holds the analog signal Vin" and the ADC 14 transforms the analog signal to a digital signal. Finally, the digital signal is processed by the microprocessor 15.

The microprocessor 15 regularly triggers the sample/hold circuit 13 to sample the analog signal Vin" by control lines. Besides, the microprocessor 15 notifies the ADC 14 to transform the sampled signal. After finishing transforming, the ADC 14 notifies the microprocessor 15 to access the digital signal that has been transformed and to perform the numerical operation.

However, the microprocessor 15 should consider the combined multiplication constants b/a that is determined by the attenuation factor 1/a of the pre-processing circuit 11 and the amplification gain b of the signal amplifying/attenuating circuit 12 when the microprocessor 15 performs the numerical operation. The resulted signal amplitude is b/a times of that of the original signal. Therefore, a circuit designer must store a restoring parameter a/b into the calculating program run by the microprocessor 15 to ensure that the numeral result conforms to the input signal Vin.

The above-described circuit architecture and signal-processing scheme are suited for the transforming procedure using one multiplication constant. For a signal-processing scheme requiring a transforming procedure using a plurality of multiplication constants, processing circuits that have switch devices for enabling different multiplication constants are required. As shown in FIG. 2 (Prior Art), the circuit comprises a signal detector 20, a pre-processing circuit 21 using multiple multiplication constants, an amplifying/attenuating circuit using multiple multiplication constants 22, a sample/hold circuit 23, an ADC 24 and a microprocessor 25. The pre-processing circuit using multiple multiplication constant 21 employs three attenuation factors, such as 1/a1, 1/a2 and 1/a3, and the amplifying/attenuating circuit using multiple multiplication constants 22 also employs three amplification gains, such as b1, b2 and b3. There are nine combined multiplication constants bn/am, where m=1~3 and n=1~3. The circuit designer must store the nine restoring parameters am/bn, where m=1~3 and n=1~3, into the calculating program run by the microprocessor 25. In these restoring parameters, the maximum is a3/b3 and the minimum is a1/b1. It can ensure that the numeral result conforms to the original analog input signal Vin. There are two conventional schemes for the microprocessor 25 to select an appropriate restoring parameter. The first scheme is to add a judging program in the calculating program run by the microprocessor 25 and to select the appropriate restoring parameter am/bn in accordance with the result form the deciding program. The second scheme is to select the appropriate restoring parameter manually.

In the first scheme for the selection of the appropriate restoring parameter, as shown in FIG. 2, the restoring parameter is initially set to the maximum a3/b3. Besides, the switch device of the pre-processing circuit 21 is switched to select the attenuation factor 1/a3 and the switch device of the amplifying/attenuating circuit 22 is switched to select the amplification gain b3, respectively. When the calculation/decision result of the microprocessor 25 reveals the overflow status, the microprocessor 25 will calculate and determine the system status by using the next maximal parameter a3/b2. In addition, the microprocessor 25 triggers the switch device of the pre-processing circuit 21 to select the attenuation factor 1/a3 and the switch device of the amplifying/attenuating circuit 22 to select the amplification gain b2, respectively. If the result is still the overflow status, the microprocessor 25 will continue calculating and determining based on the next maximal constant a3/b1. The microprocessor 25 would not stop the calculating and determining procedure until the calculating result conforms to the input signal Vin.

In the second scheme for the selection of the appropriate restoring parameter, a manual switch for changing the multiplication constant 26 is set into the control circuitry, as shown in the FIG. 3 (Prior Art). The structure of the control circuit is similar to that shown in the FIG. 2. The calculating program of the microprocessor 25 also includes a judging program, but does not automatically trigger the switch devices of the pre-processing circuit 21 and the amplifying/attenuating circuit 22, respectively. Depending on whether the calculating result reveals the overflow status or not, the user manually change the manual switch for selecting the multiplication constants 26 to the appropriate location. The manual switch for changing the multiplication constants 26 will not stop changing until the calculating result conforms to the input signal Vin.

The second scheme cannot be widely applied in the industry since it requires manually changing the manual switch for changing the multiplication constants. On the other hand, although the first scheme employs an automatic procedure for adjusting and changing multiplication constants, the microprocessor requires much time in each trial to find out the correct result. Apparently, these two schemes are not suitable for the high-speed system.

SUMMARY OF THE INVENTION

Accordingly, the purpose of the present invention is to provide an AGC circuit for analog signals, which produces gain-control signals S1 and S2 for controlling the gain of the signal amplification or attenuation, thereby automatically adjusting the amplification and attenuation of the input signals. In addition, the microprocessor selects one appropriate restoring parameters according to these gain-control signals to ensure that the result can conform to the input signal. When the AGC circuit of the present invention is applied to an analog-to-digital circuit, it can cooperate with the microprocessor to achieve the automatic gain switching function of the input analog signals by the microprocessor. In addition, in the conversion of the input signals, it can provide a quick response for the automatic adjustment of the gain.

For the above purpose, there is a preferred embodiment of an automatic gain control circuit for automatically adjusting an amplitude of an analog input signal, comprising: a buffering circuit for buffering the analog input signal and generating a first signal; an amplifying/attenuating circuit for receiving the first signal form the buffer circuit and attenuating/amplifying an amplitude of the first signal to be an output signal within an operational amplitude range by a gain value of a predetermined gain range; a pre-processing gain-adjusting circuit for receiving the analog input signal, attenuating the amplitude of the analog input signal to a voltage-divided signal within a safe amplitude range, clamping a positive cycle of the voltage-divided signal and outputting the positive cycle of the voltage-divided signal; and an amplification/attenuation gain-adjusting circuit having a comparator, for receiving the positive cycle of the voltage-divided signal from the pre-processing gain-adjusting circuit, generating a DC value by rectifying and filtering the positive cycle of the voltage-divided signal and generating a gain-adjusting signal for selecting the gain value used in the amplifying/attenuation circuit by feeding the DC value to the comparator.

The automatic gain control circuit for automatically adjusting an amplitude of an analog input signal further comprises an analog-to-digital converter having the operational amplitude range for transforming the output signal from the amplifying/attenuating circuit to a digital signal used in a microprocessor. The microprocessor receives the gain-adjusting signal produced by the amplification/attenuation gain-control circuit and selects one of restoring parameters by the gain-adjusting signal.

The buffer circuit is a voltage follower. The input signal is grounded through the high input impedance of the voltage follower. The amplifying/attenuating circuit comprises a first analog multiplexer, a second analog multiplexer, a plurality of precise resistors and a operational amplifier. The pre-processing circuit comprises a voltage-divider, a diode and a buffer amplifier. The amplification/attenuation gain-adjusting circuit includes a rectifying and filtering circuit, a comparator circuit and a diode circuit.

The amplification/attenuation gain-adjusting circuit generates a gain-adjusting signal to control the gain value used in the amplifying/attenuation and automatically adjusts the amplification/attenuation of input signals quickly. The AGC circuit of the present invention is applied to an analog-to-digital circuit, it can cooperate with the microprocessor to achieve the automatic gain switching function of the input analog signals by the microprocessor. In addition, in the conversion of the input signals, it can provide a quick response for the automatic adjustment of the gain.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE PREFERRED EMBODIMENTS

Figure 1:
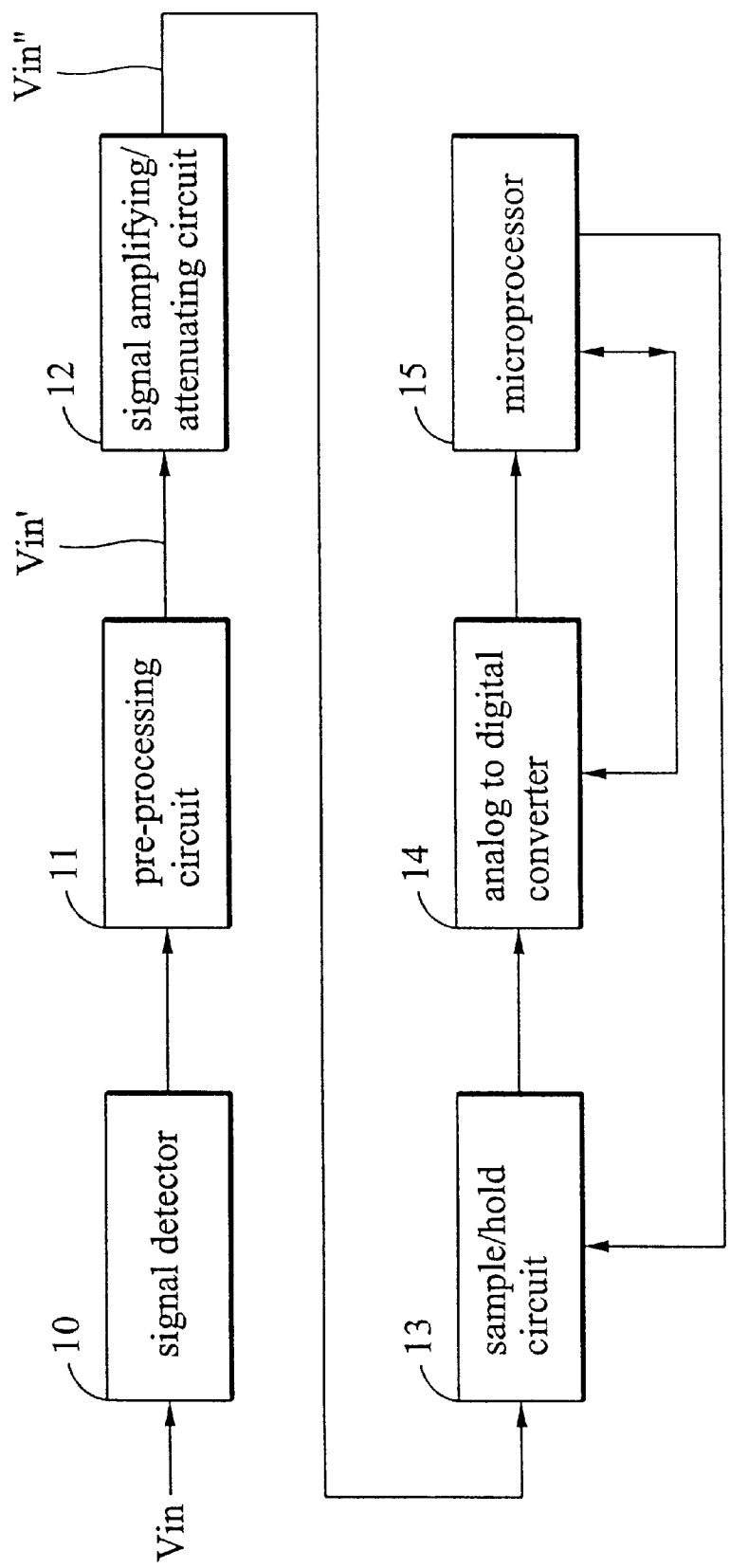
FIG. 1 (Prior Art) is a block diagram of a conventional analog-to-digital conversion circuit using one multiplication factor.
Figure 2:
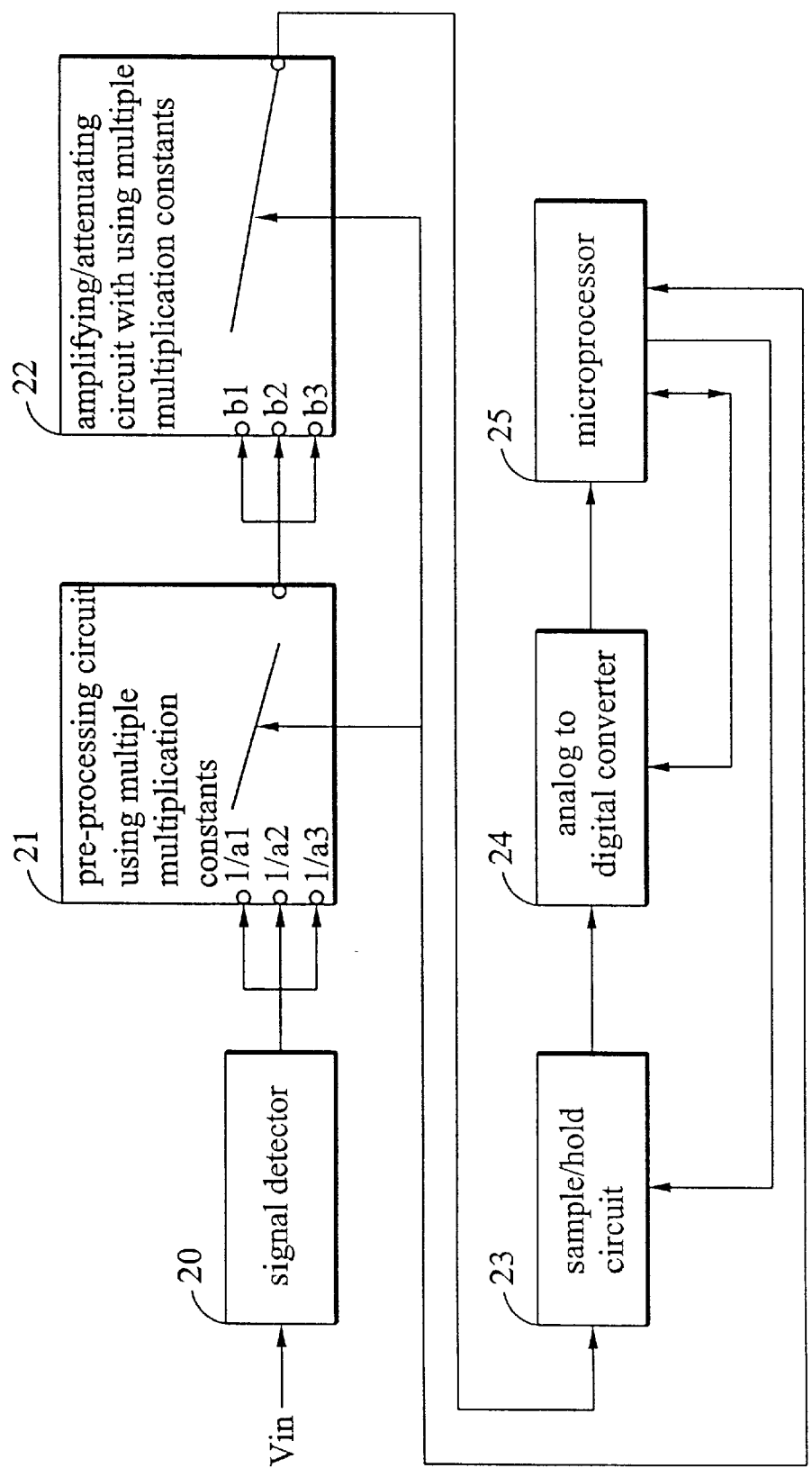
FIG. 2 (Prior Art) is a block diagram of a conventional analog-to-digital conversion circuit using multiple multiplication factors.
Figure 3:
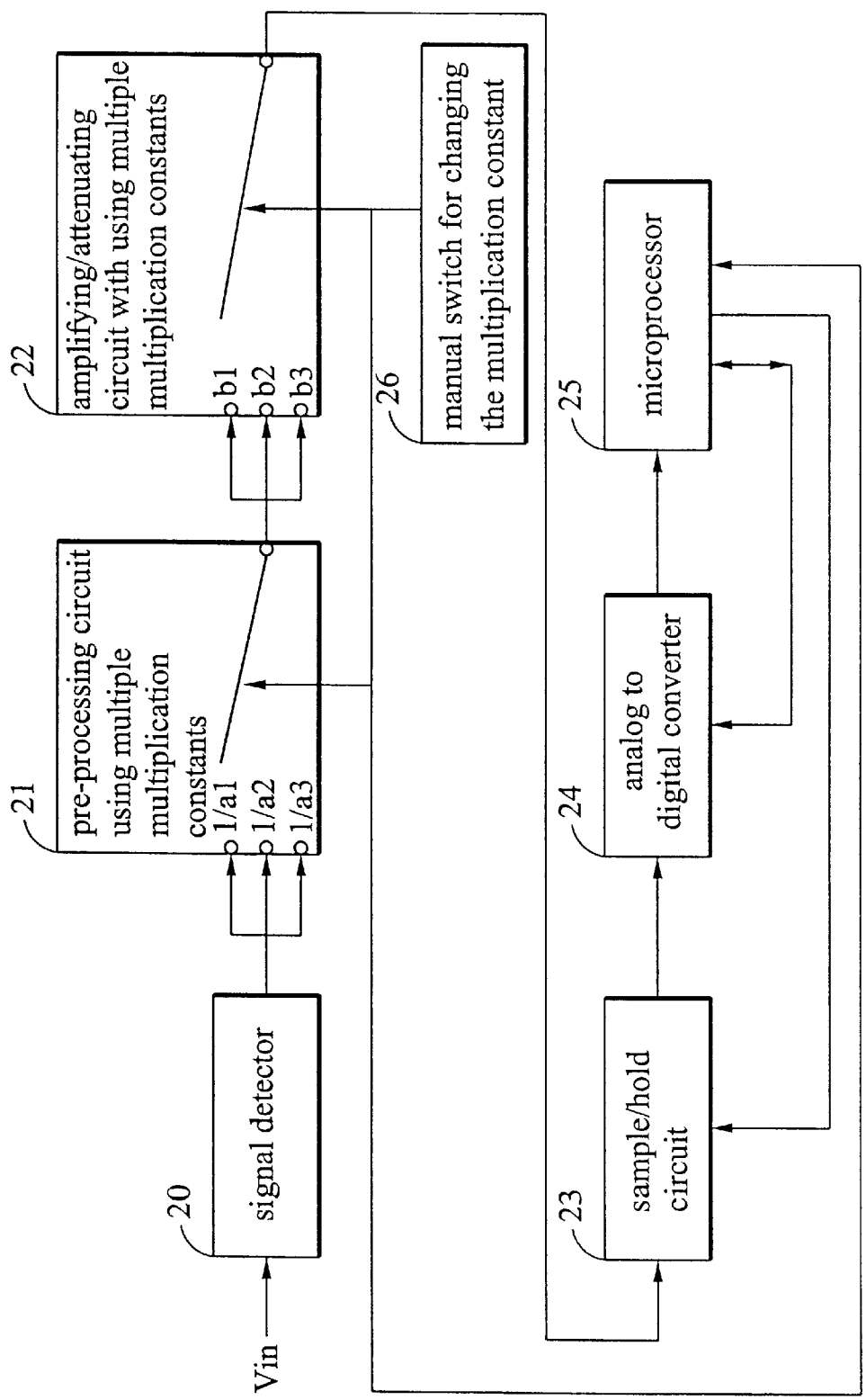
FIG. 3 (Prior Art) is a block diagram of a manually-controlled analog-to-digital conversion circuit using multiple multiplication factors in the prior art.
Figure 4:
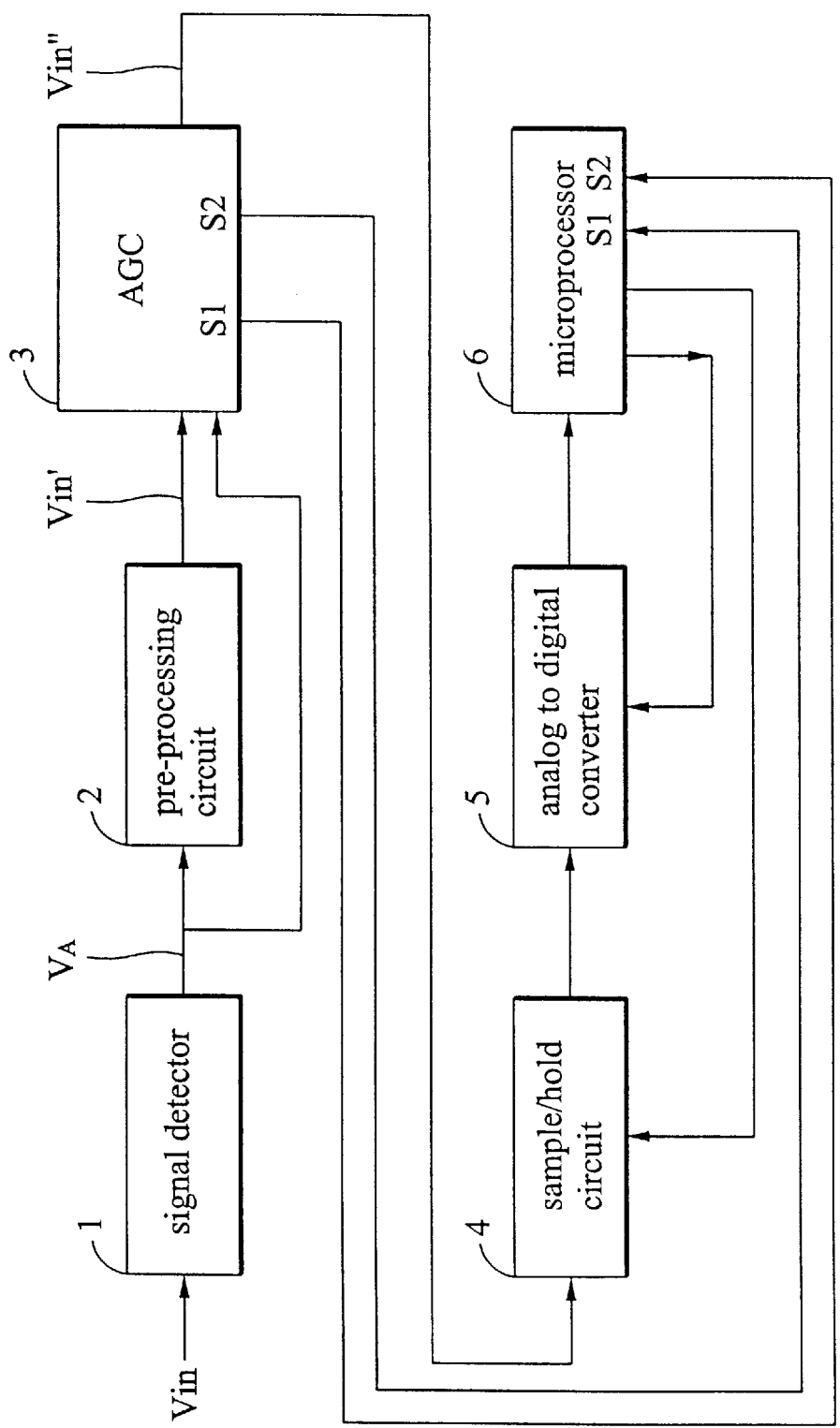
FIG. 4 is a block diagram of an analog-to-digital conversion circuit with an automatic gain control circuit in the present invention.

FIG. 4 is a block diagram of an analog-to-digital conversion circuit that comprises an AGC circuit in the embodiment of the present invention. The circuit shown in FIG. 4 includes a signal detector 1, a pre-processing circuit 2, an automatic gain control (AGC) circuit 3, a sample/hold circuit 4, an analog-to-digital converter 5 and a microprocessor 6. The AGC circuit disclosed in the present embodiment cooperates with the microprocessor 6 to quickly and automatically adjust the gain of the input analog signal.

Figure 5:
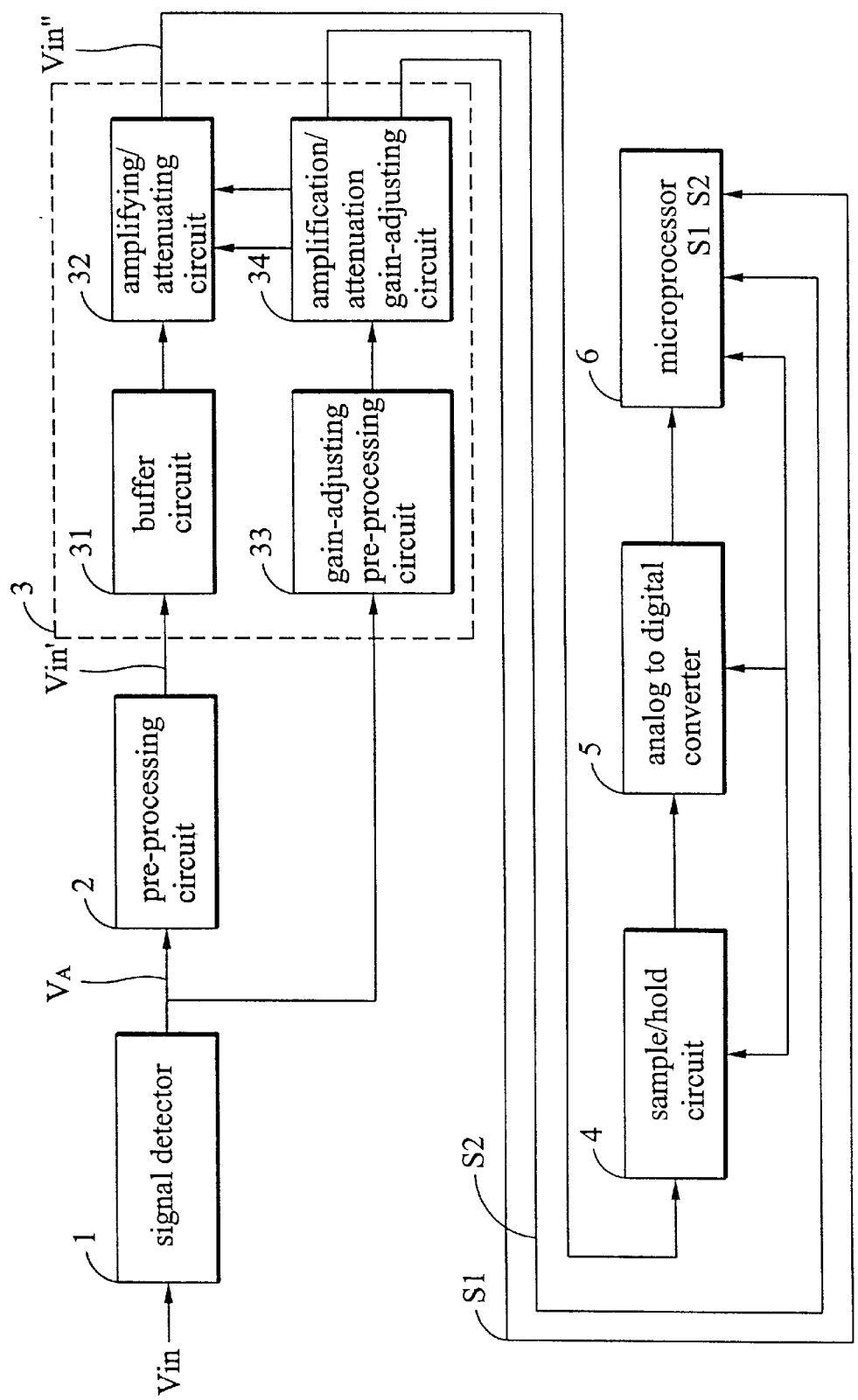
FIG. 5 is a block diagram of illustrating the control function of the automatic gain control circuit shown in the FIG. 4.

FIG. 5 is a block diagram of illustrating the control function of the AGC circuit 3 shown in the FIG. 4. As shown in the figure, the AGC circuit 3 is composed of a buffer circuit 31, an amplifying/attenuating circuit 32, a gain-adjusting pre-processing circuit 33 and a amplification/attenuation gain-adjusting circuit 34.

After the signal detector 1 detects an analog input signal Vin, it produces an output signal VA. Then, the pre-processing circuit 2 attenuates the analog input signal VA to an analog signal Vin' with an amplitude that is acceptable by the system. The buffer circuit 31 performs impedance matching and signal buffering. Then, the amplifying/attenuating circuit 32 amplifies or attenuates the analog signal Vin' to an analog signal Vin", wherein the amplification or attenuation gain is determined by the amplification/attenuation gain-adjusting circuit 34.

When the pre-processing 2 processes the input signal Vin, the output signal VA from the signal detector 1 is also transmitted to the gain-adjusting pre-processing circuit 33 of the AGC circuit 3. Then the amplification/attenuation gain-adjusting circuit 34 produces gain-adjusting signals S1 and S2. The gain-adjusting signals S1 and S2 are transmitted to the amplifying/attenuating circuit 32 to select the amplification or attenuation gain of the signal. The gain-adjusting signals S1 and S2 are also transmitted to the microprocessor 6.

Figure 6:
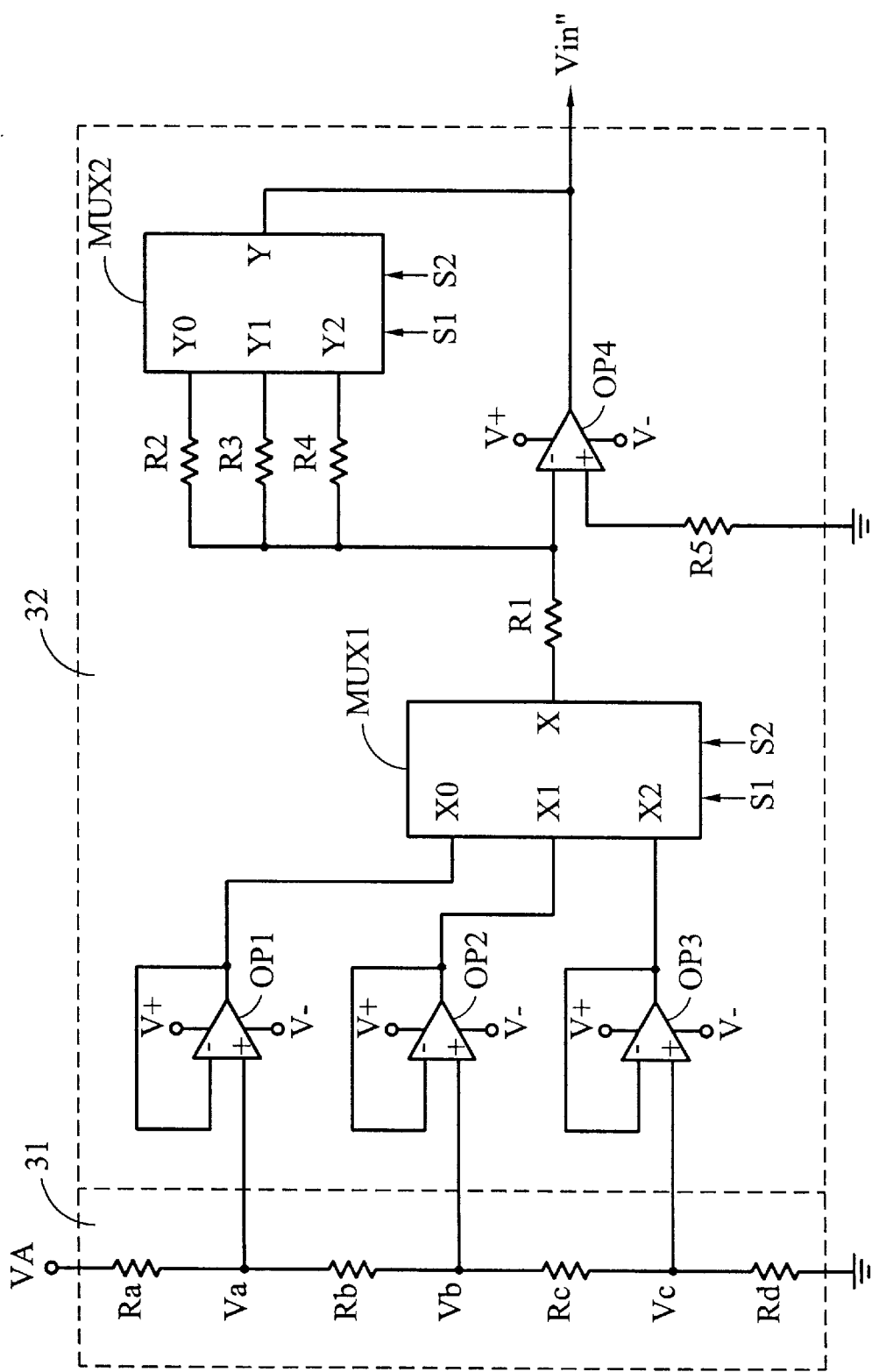
FIG. 6 is a detailed circuit diagram of the buffer circuit and the amplifying/attenuating circuit shown in FIG. 5.
Figure 7:
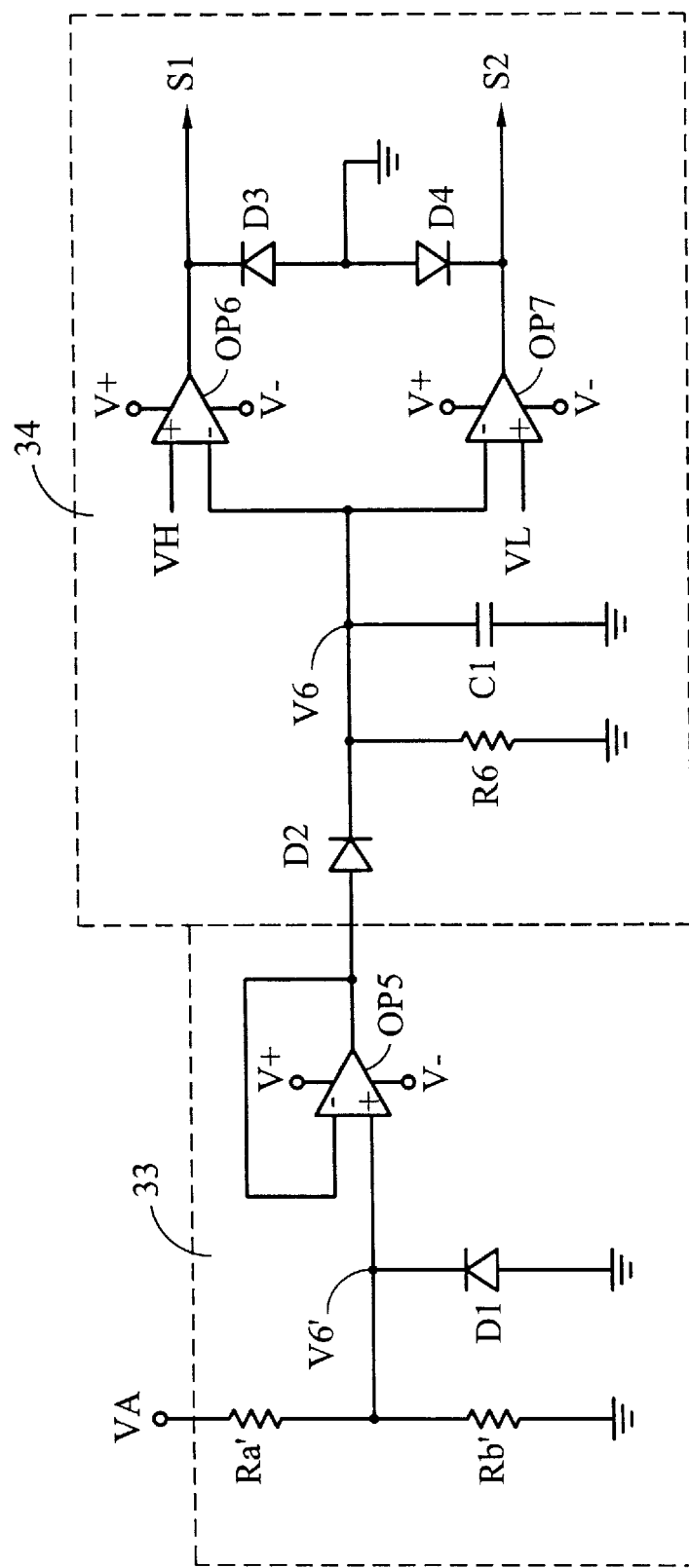
FIG. 7 is a detailed circuit diagram of the gain-adjusting pre-processing circuit and the amplification/attenuation gain-adjusting circuit shown in FIG. 5.

FIG. 6 is a detailed circuit diagram of the buffer circuit 31 and the amplifying/attenuating circuit 32 shown in FIG. 5. FIG. 7 is a detailed circuit diagram of the gain-adjusting pre-processing circuit 33 and the amplification/attenuation gain-adjusting circuit 34 shown in FIG. 5. In the present embodiment, the buffer circuit 31 is a voltage follower. The input signal is grounded through the high input impedance of the voltage follower. The amplifying/attenuating circuit 32 comprises a first analog multiplexer MUX1, a second analog multiplexer MUX2, a plurality of precise resistors and an operational amplifier OP4.

The first analog multiplexer MUX1 has four input channels an output channel and two controlling lines for switching. The input channels are coupled to the outputs of the butter circuit 31. Two controlling lines are connected to the gain-adjusting signals S1 and S2, respectively, for selecting one of the four input channels to connect with the output channel.

The second analog multiplexer MUX2, three precise resistors R2, R3 and R4 determining three multiplication constants and the high precise operational amplifier OP4 constitute the inverting amplifier for automatic gain control. Three input channels of the second analog multiplexer are set to the three multiplication constants, respectively. The gain-adjusting signals S1 and S2 are used to select one of the three input channels to couple to the output channel. It means that the gain-adjusting signals S1 and S2 are used to select one of the multiplication constants for cooperating with the high precise operational amplifier OP4 to constitute the inverting amplifier for amplifying or attenuating the amplitude of the signal to an operation range that the analog-to-digital converter 5 could accept.

The gain-adjusting pre-processing circuit 33 comprises voltage divider Ra' and Rb', a diode D1 and a buffer amplifier OP5. The voltage divider is constituted by serially connected high- and low-resistance resistors and used to attenuate the input signal VA. The voltage-divided signal is clamped in the positive cycle by the diode D1. Finally, the positive cycle of the voltage-divided signal is fed to the buffer circuit composed of a grounded voltage follower.

The amplification/attenuation gain-adjusting circuit 34 comprises a rectifying/filtering circuit, two comparators and two diodes. The rectifying/filtering circuit, which is composed of a rectifying diode D2 and a filter including a resistor R6 and a capacity C1, is used to rectify and filter the positive cycle of the voltage-divided signal from the pre-processing circuit 33 and to generate a DC signal V6. The comparator includes a high-level comparator OP6 and a low-level comparator OP7. The reference voltage VH of the high-level comparator OP6 is the DC value of the transition point (10 volts) between the middle gain range AM (1–10 volts) and the low gain range AL (10–100 volts). The reference voltage VL of the low-level comparator OP7 is the DC value of the transition point (1 volt) between the high gain range AH (0–1 volt) and the middle gain range AM (1–10 volts). After the DC signal V6 is fed to the high-level comparator and the low-level comparator for comparison, the gain-adjusting signals S1 and S2 are generated.

In the amplification/attenuation gain-adjusting circuit 34, there are two clamping diodes D3 and D4 located at the output terminals of the high-level comparator OP6 and the low-level comparator OP7, respectively, for ensuring the output level of the comparator is constrained between the power source of the comparator V+ ("1") and ground ("0") to protect the microprocessor 6.

In the embodiment of the present invention, the operation range of the analog input signal VA is between 4–10 volts. Suppose that the ranges for automatically adjusting gains in the embodiment of the present invention include the high gain range AH (0–1 volt), the middle gain range AM (1–10 volts) and the low gain range AL (10–100 volts). The truth table for adjusting gains and the truth table of the analog multiplexer MUX1 and the analog multiplexer MUX2 in the embodiment of the present invention are shown in Table 1 and Table 2:

TABLE 1

| S1 | S2 | X | Y |
|----|----|----|----|
| 1 | 1 | X0 | Y0 |
| 1 | 0 | X1 | Y1 |
| 0 | 1 | X2 | Y2 |
| 0 | 0 | X3 | Y3 |

TABLE 2

| | | S1 | S2 | X | Y |
|---|---|----|----|----|----|
| VA < 1 V | Vb < VL < VH | 1 | 1 | X0 | Y0 |
| 1 V < VA < 10 V | VL < Vb < VH | 1 | 0 | X1 | Y1 |
| 10 V < VA < 100 V | VL < VH < Vb | 0 | 0 | X3 | Y3 |

The input signal VA is directly transmitted to the pre-processing circuit 2. The pre-processing circuit 2 in the embodiment is a voltage divider composed of the resistors Ra, Rb, Rc and Rd (shown in the FIG. 6) for producing voltage-divided signals Va, Vb and Vc, wherein Va>Vb>Vc;

Va=VA*(Rb+Rc+Rd)/R, where the amplification gain X0=(Rb+Rc+Rd)/R;

Vb=VA*(Rc+Rd)/R, where the amplification gain X1=(Rc+Rd)/R;

Vc=VA*Rd/r, where the amplification gain X3=Rd/R; and

R=Ra+Rb+Rc+Rd.

The voltage-divided signals Va, Vb and Vc matches impedance with the system by the operational amplifiers OP1, OP2 and OP3 in the buffer circuit 31, respectively. Then these voltage-divided signals are fed to the input nodes X0, X1 and X3 of the first analog multiplexer MUX1 in the amplifying/attenuating circuit 32, respectively. Which one of these voltage-divided signals is selected is decided by the gain-adjusting signals S1 and S2 produced in the amplification/attenuation gain-adjusting circuit 34 in accordance with the truth table for adjusting gains (table 1). Besides, the gain-adjusting signals S1 and S2 also select one of a plurality of amplification gains Y0 Y1 or Y3 according to the operational amplifier OP4 and the second analog multiplexer MUX2.

Amplification gain: Y0=−R2/R1;

Amplification gain: Y1=−R3/R1; and

Amplification gain: Y3=−R4/R1.

The amplification gain of the output signal from the operational amplifier OP4 may be X0*Y0=−(Rb+Rc+Rd)*R2/R*R1; or X1*Y1=−(Rc+Rd)*R3/R*R1; or X3*Y3=−Rd*R4/R*R1.

When the input signal VA is directly fed to the pre-processing circuit 2, the signal VA is also fed to the gain-adjusting pre-processing circuit 33. The gain-adjusting pre-processing circuit 33 of the preferred embodiment comprises a voltage-divided circuit composed of the resistor Ra' and the resistor Rb', the clamping diode D1 and the buffer amplifier OP5 (referring to FIG. 7). The gain-adjusting pre-processing circuit 33 is used to acquire the positive cycle of a gain-determining signal V6'. Then, the positive cycle of the gain-determining signal V6' passes through the rectifying and filtering circuit of the amplification/attenuation gain-adjusting circuit 34, which is composed of the diode D2, the resistor R6 and the capacitor C1, for generating a DC gain-determining signal V6. The DC gain-determining signal V6 is fed to the high-level comparator OP6 and the low-level comparator OP7 for comparison and the gain-adjusting signals S1 and S2 are generated and used for the gain selection in the analog multiplexers MUX1 and MUX2. The reference voltage VH used in the high-level comparator OP6 is the DC value of the transition point (10 volts) between the middle gain range AM (1–10 volts) and the low gain range AL (10–100 volts). The reference voltage VL used in the low-level comparator OP7 is the DC value of the transition point (1 volt) between the high gain range AH (0–1 volt) and the middle gain range AM (1–10 volts) in the embodiment. The function of the diodes D3, D4 located at the outputs of the high-level comparator OP6 and the low-level comparator OP7 is to clamp the positive cycle of the output signals of the comparators to ensure that the gain-adjusting signals S1 and S2 are in the positive level.

When the amplitude of the input signal VA is in the range of 0–1 volt for automatically adjusting gains, the DC gain-determining signal V6 is set as V6<VL<VH. Therefore, the gain-adjusting signal S2 (i.e. the output of the low-level comparator OP7) is in the high level, that is S2="1", and the gain-adjusting signal S1 (i.e. the output of the high-level comparator OP6) is also in the high level, that is S1="1". Referring to the truth table 1 of the analog multiplexer MUX1 and the analog multiplexer MUX2 with respect to (S1, S2)=(1, 1), node x of the analog multiplexer MUX1 is coupled to node X0 in the amplifying/attenuating circuit 32 and node Y of the analog multiplexer MUX2 is coupled to node Y0. Accordingly, the peak value VY in the output node Y of the operational amplifier OP4 is set as:

$$VY0=\sqrt{2}*VA*x0*Y0=\sqrt{2}VA*[-(Rb+Rc+Rd)*R2]/(R*R1) \text{ wherein } R=Ra+Rb+Rc+Rd.$$

After the peak value VY is sampled by the sample/hold circuit 4, the analog to digital converter 5 transforms the sampled value to digital codes. Then, the microprocessor 6 processes the digital codes. Besides, there are two problems for the operation of the microprocessor 6. The first one is that the numeral result, which is not deduced by the original input signal VA, is deduced by the original input signal VA attenuated by a factor of $\sqrt{2}VA*[-(Rb+Rc+Rd)*R2]/(R*R1)$. Therefore, the correct result can be acquired by multiplying the value VY by a restoring parameter $VA/VY0=(R*R1)/[\sqrt{2}*(Rb+Rc+Rd)*R2]$. It is necessary to store the restoring parameter VA/VY0 in the problem in advance.

In addition, when the amplitude of the input signal VA is in the range of 1–10 volts for automatically adjusting gains, the DC gain-determining signal V6 is set as VL<V6<VH. Since the gain-adjusting signals (S1, S2) is (1,0), node X of the analog multiplexer MUX1 of the amplifying/attenuating circuit 32 is coupled to node X1 and node Y of the analog multiplexer MUX2 is coupled to node Y1 based on the truth table 1 of the analog multiplexer MUX1 and the analog multiplexer MUX2. Accordingly, the peak value VY in the output node Y in the operational amplifier OP4 is set as:

$$VY1=\sqrt{2}*VA*X1*Y1=\sqrt{}+e,\text{fra } 2+ee\ VA*[-(Rc+Rd)*R3]/(R*R1),$$
wherein R=Ra+Rb+Rc+Rd.

Therefore, the restoring parameter $VA/VY1=(R*R1)/[-\sqrt{2}*(Rc+Rd)*R3]$ is stored in the program in advance.

When the amplitude of the input signal VA is in the range of 10–100 volts for automatically adjusting gains, the DC gain-determining signal V6 is set as VL<VH<V6. Since the gain-adjusting signals (S1, S2) is (0,0), node X of the analog multiplexer MUX1 of the amplifying/attenuating circuit 32 is coupled to node X3 and node Y of the analog multiplexer MUX2 is coupled to node Y3 based on the truth table 1 of the analog multiplexer MUX1 and the analog multiplexer MUX2. Accordingly, the peak value VY of the output node Y of the operational amplifier OP4 is set as:

$$VY3=\sqrt{2}*VA*x3*Y3=-\sqrt{2}VA*Rd*R4/(R*R1), \text{ wherein } R=Ra+Rb+Rc+Rd$$

The restoring parameter $VA/VY3=(R*R1)/(-\sqrt{2}*Rd*R4)$ is stored in the program in advance.

The second problem is how to select an appropriate restoring parameter in the program when the microprocessor 6 processes the procedure. The gain-adjusting signals (S1, S2) can control the attenuation gain of the signal VA. Therefore, the microprocessor 6 can select the appropriate restoring parameter based on the gain-adjusting signals (S1, S2). Therefore, when the gain-adjusting signals S1 and S2 are used to control the attenuation factor, they are also transmitted to the microprocessor 6. The microprocessor 6 select the appropriate restoring parameter by the gain-adjusting signals (S1, S2) to obtain the correct operational result.

As the above described, we can control the amplifying/attenuating gain of the analog signal through the control circuit in the present invention. Besides, the controlling circuit can be used in a digital circuit. With a microprocessor, the controlling circuit can adjust the gain of the analog signal automatically and build an analog/digital converter with high speed. Therefore, the present invention is useful in industry.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An automatic gain control circuit for automatically adjusting an amplitude of an analog input signal, comprising:
    a buffering circuit for buffering the analog input signal and generating a first signal;
    an amplifying/attenuating circuit for receiving the first signal form the buffer circuit and attenuating/amplifying an amplitude of the first signal to be an output signal within an operational amplitude range by a gain value of a predetermined gain range;
    a pre-processing gain-adjusting circuit for receiving the analog input signal, attenuating the amplitude of the analog input signal to a voltage-divided signal within a safe amplitude range, clamping a positive cycle of the voltage-divided signal and outputting the positive cycle of the voltage-divided signal; and
    an amplification/attenuation gain-adjusting circuit having a comparator, for receiving the positive cycle of the voltage-divided signal from the pre-processing gain-adjusting circuit, generating a DC value by rectifying and filtering the positive cycle of the voltage-divided signal and generating a gain-adjusting signal for selecting the gain value used in the amplifying/attenuation circuit by feeding the DC value to the comparator.

2. The automatic gain control circuit as recited in claim 1, further comprising an analog-to-digital converter having the operational amplitude range for transforming the output signal from the amplifying/attenuating circuit to a digital signal used in a microprocessor.

3. The automatic gain control circuit as recited in claim 2, wherein the microprocessor receives the gain-adjusting signal produced by the amplification/attenuation gain-control circuit and selects one of restoring parameters by the gain-adjusting signal.

4. The automatic gain control circuit as recited in claim 1, wherein the buffering circuit is a voltage follower.

5. The automatic gain control circuit as recited in claim 1, wherein the amplifying/attenuating circuit comprises a first analog multiplexer, a second analog multiplexer, a plurality of precise resistors and a operational amplifier.

6. The automatic gain control circuit as recited in claim 5, wherein the first analog multiplexer has four input channels, an output channel and two controlling lines; the input channel being coupled to an output terminal of the buttering circuit; the controlling lines being coupled to the gain-adjusting signals for selecting one of the four input channels to couple to the output channel.

7. The automatic gain control circuit as recited in claim 5, wherein the second analog multiplexer, the precise resistors and the operational amplifier constitute an inverting amplifier for automatically adjusting gains; the precise resistors being connected to a plurality of input channels of the second analog multiplexer, respectively; the gain-adjusting signal being used to select one of the input channels of the second analog multiplexer to connect an output channel thereof.

8. The automatic gain control circuit as recited in claim 1, wherein the pre-processing circuit comprises a voltage-divider, a diode and a buffer amplifier; the voltage-divider being formed by a plurality of serially connected resistors with different resistance values and used to attenuate the analog input signal; the voltage-divided signal being clamped in the positive cycle by the diode; the positive cycle of the voltage-divided signal passes through the buffer amplifier being grounded.

9. The automatic gain control circuit as recited in claim 1, wherein the amplification/attenuation gain-adjusting circuit includes a rectifying and filtering circuit, a comparator circuit and a diode circuit.

10. The automatic gain control circuit as recited in claim 9, wherein the rectifying and filtering circuit includes a rectifying diode and a filtering circuit that comprises a resistor and a capacitor; the rectifying and filtering circuit being used to rectify and filter the positive cycle of the voltage-divided signal of the positive period from the pre-processing gain-adjusting circuit to a DC signal.

11. The automatic gain control circuit as recited in claim 9, wherein the comparator circuit includes a high-level comparator and a low-level comparator; the gain-adjusting signal being generated by comparing the DC signal with a high-level reference voltage of the high-level comparator and a low-level reference voltage of the low-level comparator.

12. The automatic gain control circuit as recited in claim 11, wherein the diode circuit comprises two diodes located at outputs of the high-level comparator and the low-level comparator, respectively, for ensuring that output signals of the high-level comparator and the low-level comparator are contrained between a power level "1" and ground "0".

* * * * *